US005308937A

United States Patent [19]

Torii

[11] Patent Number: 5,308,937

[45] Date of Patent: May 3, 1994

[54] LOUDSPEAKER APPARATUS FOR ELECTRONIC KEYBOARD MUSICAL INSTRUMENT

[75] Inventor: Katsuhiko Torii, Hamamatsu, Japan

[73] Assignee: Kabushiki Kashia Kawai Gakki Seisakusho, Hamamatsu, Japan

[21] Appl. No.: 974,433

[22] Filed: Nov. 12, 1992

[30] Foreign Application Priority Data

Mar. 24, 1992 [JP] Japan .............................. 4-15308[U]

[51] Int. Cl.[5] .............................................. H05K 5/00

[52] U.S. Cl. .................................... 181/141; 181/144; 181/156

[58] Field of Search ............... 181/141, 144, 148, 150, 181/154, 155, 156; 84/423 R, 718, DIG. 1, 719, 743, 744, 644, 670; 381/118

[56] References Cited

U.S. PATENT DOCUMENTS 4,601,361 7/1986 Nakada .............................. 181/141

5,086,686 2/1992 Misawa et al. ................. 181/144 X

*Primary Examiner*—Michael L. Gellner

*Assistant Examiner*—Khanh Dang

*Attorney, Agent, or Firm*—Armstrong, Westerman, Hattori, McLeland & Naughton

[57] ABSTRACT

A loudspeaker apparatus for an electronic keyboard musical instrument has a shelf board constituting a casing of the musical instrument. The shelf board has a sound emission opening. A loudspeaker is mounted on the shelf board in alignment with a fringe of the sound emission opening. A speaker box is mounted on the shelf board so as to enclose the loudspeaker.

7 Claims, 4 Drawing Sheets

LOUDSPEAKER APPARATUS FOR ELECTRONIC KEYBOARD MUSICAL INSTRUMENT

FIELD OF THE INVENTION

Background of the Invention

The present invention relates to a loudspeaker apparatus for an electronic keyboard musical instrument such as an electronic piano or the like.

As a loudspeaker apparatus for electronic keyboard musical instrument, there is conventionally known such a one as shown in FIG. 6. In this apparatus, a pair of right and left sound emission openings b, b are provided in a shelf board "a" of a casing f which constitutes the casing of the musical instrument. Each of loudspeakers c, c which are responsive to lower acoustic frequencies (e.g., woofers) is mounted on the shelf board "a" in abutment with the respective fringe of the sound emission openings b, b. Each of loudspeakers d, d which are responsive to higher acoustic frequencies (e.g., tweeters) is mounted on the shelf board "a" in close proximity to the loudspeakers c, c. Further, as shown in FIG. 7, there is known another loudspeaker apparatus in which speaker boxes e, e, each containing therein a loudspeaker c which is responsive to lower acoustic frequencies and a loudspeaker d which is responsive to higher acoustic frequencies, are mounted on the right and the left sides of the shelf board "a."

The speaker apparatus shown in FIG. 6 has a disadvantage in that, because there is no speaker box, the low-frequency range characteristics are poor. In the speaker apparatus shown in FIG. 7, since the speakers c, d are provided inside the casing f of the musical instrument, the sounds emitted from the speakers c, d interfere with each other within the casing f of the musical instrument or resonate with the casing f of the musical instrument. As a consequence, unnecessary resonated sounds will occur, resulting in a disadvantage in that good reproduced sounds are hard to be obtained.

SUMMARY OF THE INVENTION

An object of the present invention is to provide a loudspeaker apparatus for an electronic keyboard musical instrument in which the above described disadvantages of the conventional speaker apparatuses are eliminated.

According to a first aspect of the present invention, the foregoing and other objects are attained by a loudspeaker apparatus for an electronic keyboard musical instrument, the apparatus comprising a shelf board which constitutes a casing of the musical instrument and which has a sound emission opening, a loudspeaker mounted on the shelf board in alignment with the sound emission opening, and a speaker box mounted on the shelf board so as to enclose the loudspeaker.

According to a second aspect of the present invention, a loudspeaker apparatus for an electronic keyboard musical instrument comprises a shelf board which constitutes a casing of the musical instrument and which has a sound emission opening and a port, a loudspeaker mounted on the shelf board in alignment with the sound emission opening and a speaker box mounted on the shelf board so as to enclose the loudspeaker and the port.

According to a third aspect of the present invention, a loudspeaker apparatus for an electronic keyboard musical instrument comprises a shelf board which constitutes a casing of the musical instrument and which has a sound emission opening, a loudspeaker mounted on the shelf board in alignment with the sound emission opening, and a speaker box which is mounted on the shelf board so as to enclose the loudspeaker and which has a port.

According to the first aspect of the present invention, sounds are emitted from the loudspeaker through the sound emission opening downwards of the shelf board. The loudspeaker is mounted on the shelf board and is also enclosed by the speaker box. The sounds are therefore not emitted towards the inside of the casing of the musical instrument. Consequently, there will be eliminated those disturbances in the characteristics of the reproduced sounds which are caused by the interferences of sounds inside the casing of the musical instrument and/or the resonances of the casing of the musical instrument.

According to the second aspect of the present invention, aside from the constituting elements of the first aspect of the present invention, there is further provided the port. According to the third aspect of the present invention, aside from the constituting elements of the first aspect of the present invention, there is further provided the port which is provided in the speaker box. Therefore, the sounds to be emitted from the rear side of the loudspeaker are emitted downwards or upwards of the shelf board through the port due to Helmholz's resonance, resulting in improved low-frequency characteristics.

BRIEF DESCRIPTION OF THE DRAWINGS

The above and other objects and the attendant advantages of the present invention will become readily apparent by reference to the following detailed description when considered with the accompanying drawings wherein.

DETAILED DESCRIPTION OF THE INVENTION

Embodying examples of the present invention will now be explained with reference to the accompanying drawings.

Figure 1:
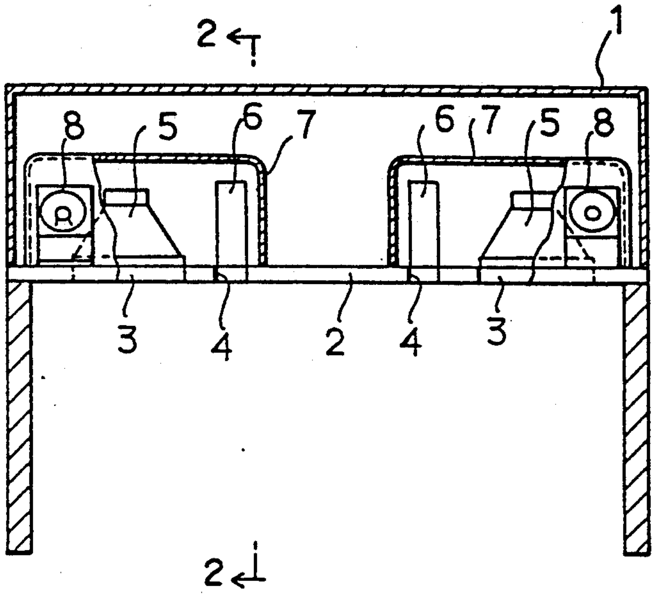
FIG. 1 is a sectional view, taken along the line 1—1 in FIG. 2, of one example of the present invention apparatus.
Figure 2:
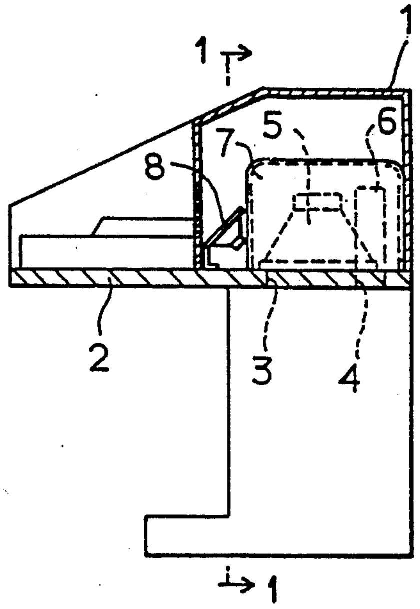
FIG. 2 is a sectional view taken along the line 2—2 in FIG. 1.
Figure 3:
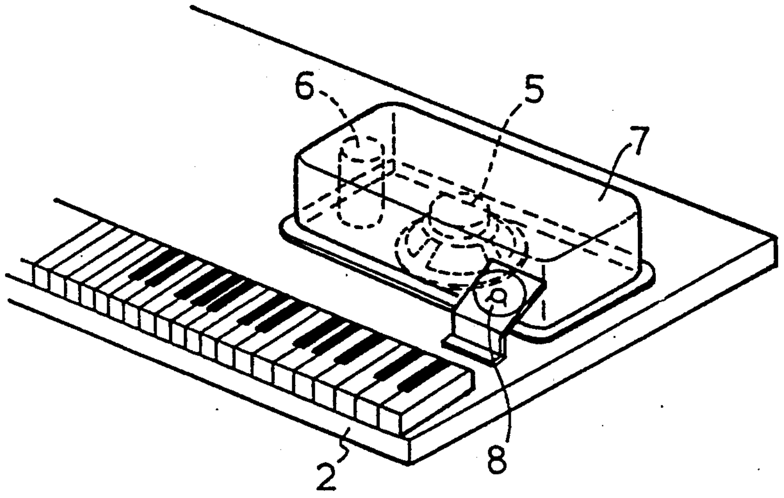
FIG. 3 is a perspective view of an important part of the above example.

One example of the present invention is shown in FIG. 1 through FIG. 3 in which numeral 1 denotes a casing of an electronic keyboard musical instrument such, for example, as an electronic piano. Numeral 2 denotes a shelf board of the musical instrument casing 1.

On the right and the left sides of the shelf board 2, there are respectively provided a sound emission opening 3 and a port 4. In alignment with each of the sound emission openings 3, 3, there is mounted a loudspeaker 5 which is responsive to low and intermediate acoustic frequencies (e.g., a woofer). In alignment with each of the ports 4, 4, there is mounted a duct 6 on the shelf board 2. A speaker box 7 is mounted on the shelf board 2 such that it respectively encloses each set of the loudspeaker 5 and the duct 6. Loudspeakers responsive to higher acoustic frequencies (e.g., tweeters) 8, 8 are mounted on the shelf board 2, each in close proximity to the right and the left speaker boxes 7, 7.

Figure 4:
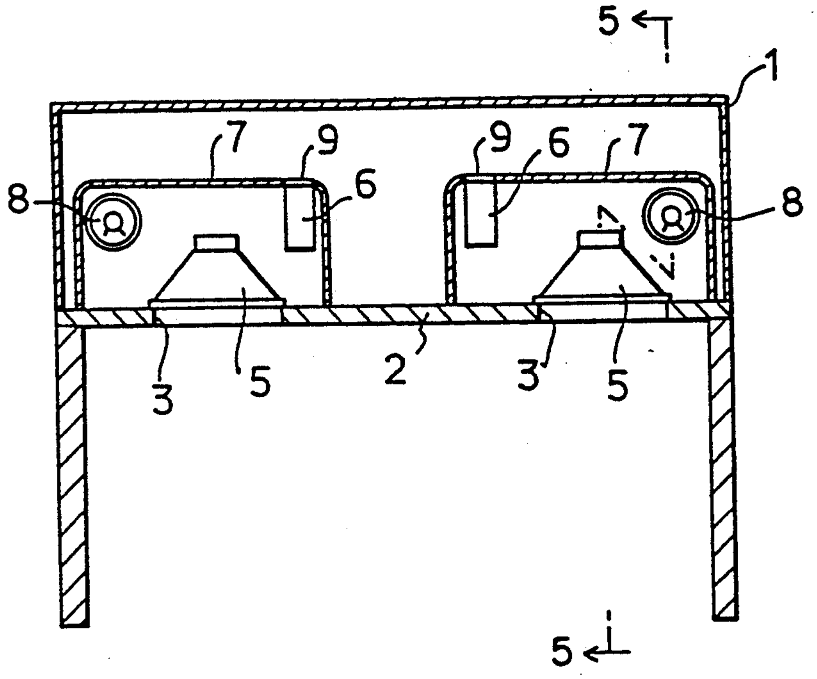
FIG. 4 is a sectional view, taken along the line 4—4 in FIG. 5, of another example of the present invention apparatus.
Figure 5:
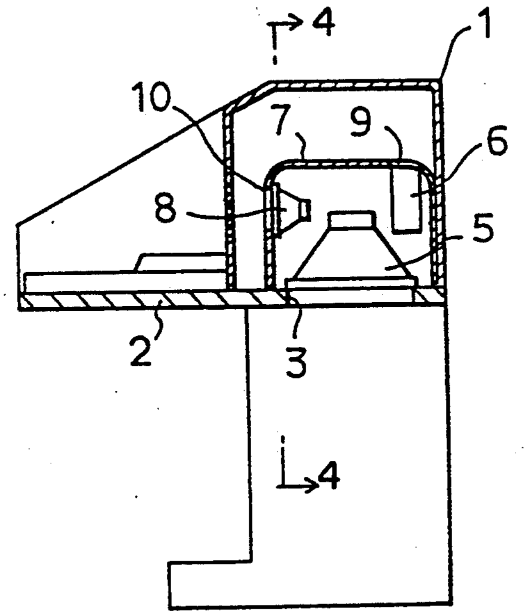
FIG. 5 is a sectional view taken along the line 5—5 in FIG. 4.
Figure 6A:
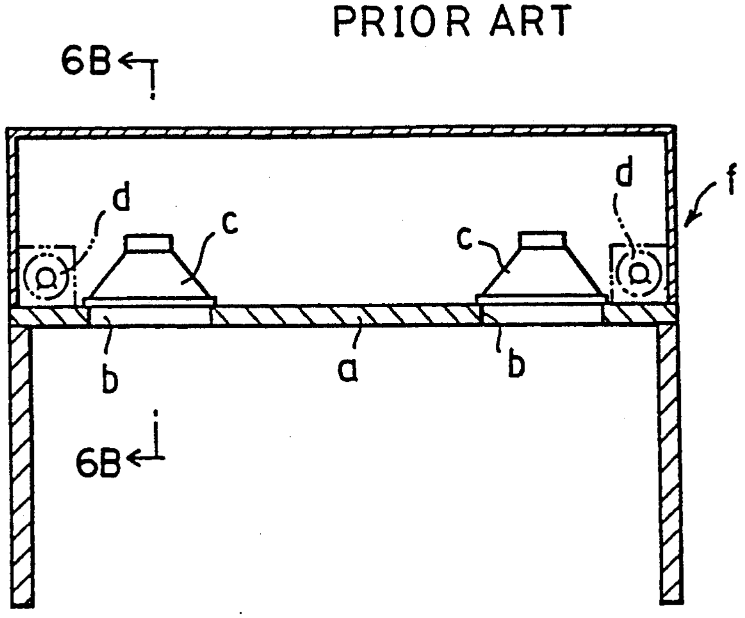
FIG.6(A) PRIOR ART
FIG. 6(A) is a sectional view, taken along the line 6A—6A in FIG. 6(B), of one example of a conventional apparatus
Figure 6B:
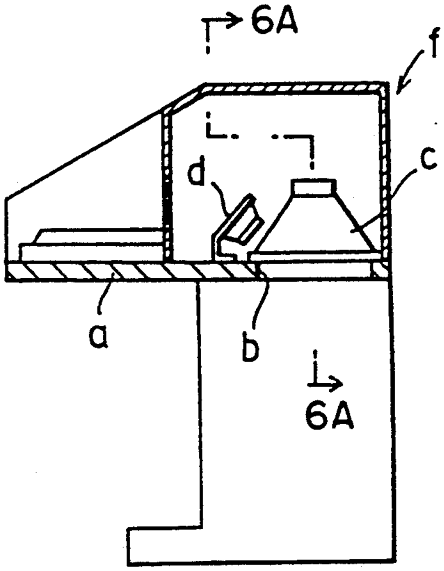
FIG.6(B) PRIOR ART
FIG. 6(B) is a sectional view taken along the line 6B—6B in FIG. 6(A) thereof.
Figure 7A:
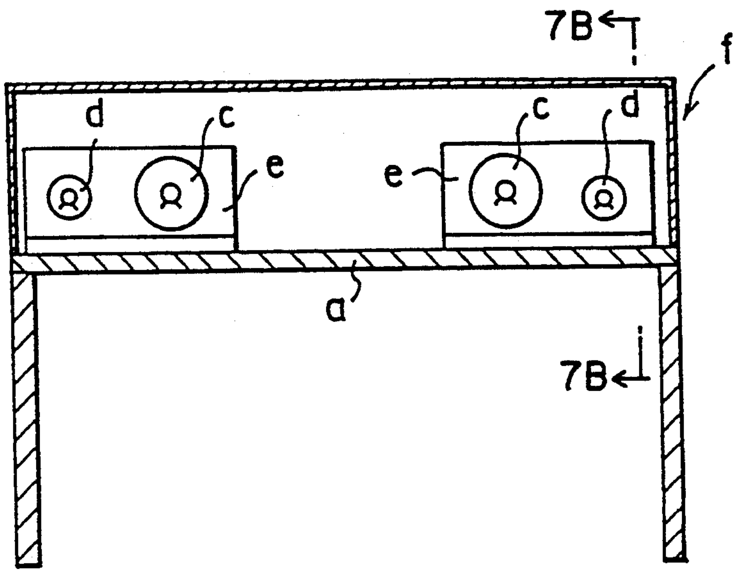
FIG.7(A) PRIOR ART
FIG. 7(A) is a sectional view, taken along the line 7A—7A in FIG. 7(B), of another example of a conventional apparatus
Figure 7B:
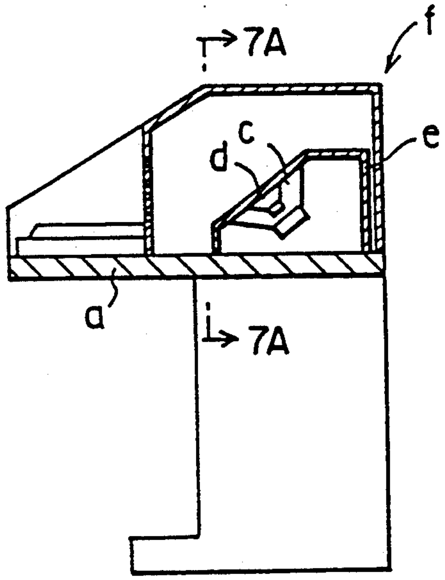
FIG.7(B) PRIOR ART
FIG. 7(B) is a sectional view taken along the line 7B—7B in FIG. 7(A) thereof.

Another embodying example is shown in FIG. 4 and FIG. 5. In this example, the duct 6 is mounted in alignment with the fringe of a port 9 which is provided on an upper part of the speaker box 7. The loudspeaker 8 responsive to higher acoustic frequencies (e.g., a tweeter) is also mounted on an internal wall of the speaker box 10 in alignment with a sound emission opening 10 which is provided in an upper portion of the speaker box 7. The remaining construction is the same as that of the above-described example.

In the above two examples, there is respectively provided a duct 6, but this duct 6 needs not always be provided.

Since the first through the third aspects of the present invention have the above-described constructions, they have an advantage in that those disturbances in the characteristics of the reproduced sounds which are caused by the interferences inside the casing of the musical instrument and/or the resonances of the casing of the musical instrument can be eliminated. According to the second and the third aspects of the present invention, there is an advantage in that the low-frequency characteristics are improved.

It is readily apparent that the above-described loudspeaker apparatus for an electronic keyboard musical instrument meets all of the objects mentioned above and also has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. A loudspeaker apparatus for an electronic keyboard musical instrument, said apparatus comprising:

- a shelf board constituting a casing of said musical instrument, said shelf board having a sound emission opening;
- a first loudspeaker mounted on said shelf board in alignment with said sound emission opening; and
- a speaker box mounted on said shelf board so as to fully enclose said first loudspeaker, wherein said loudspeaker apparatus includes said first loudspeaker responsive to lower acoustic frequencies and a second loudspeaker responsive to higher acoustic frequencies mounted on said shelf board outside and in close proximity to said speaker box.

2. A loudspeaker apparatus for an electronic keyboard musical instrument, said apparatus comprising:

- a shelf board constituting a casing of said musical instrument, said shelf board having both a sound emission opening and a port separate from said sound emission opening;
- a first loudspeaker mounted on said shelf board in alignment with said sound emission opening;
- a speaker box mounted on said shelf board so as to fully enclose both said first loudspeaker and said port,
- wherein said loudspeaker apparatus includes said first loudspeaker responsive to lower acoustic frequencies and a second loudspeaker responsive to higher acoustic frequencies mounted on said shelf board outside and in close proximity to said speaker box.

3. A loudspeaker apparatus for an electronic keyboard musical instrument according to claim 2, further comprising a duct mounted on said shelf board with one end of said duct being in alignment with said port.

4. A loudspeaker apparatus for an electronic keyboard musical instrument, said apparatus comprising:

- a shelf board constituting a casing of said musical instrument, said shelf board having a first sound emission opening;
- a first loudspeaker mounted on said shelf board in alignment with said first sound emission opening; and
- a speaker box mounted on said shelf board so as to enclose said first loudspeaker, said speaker box having a port,
- wherein said speaker box includes a second sound emission opening, and
- wherein said first loudspeaker is responsive to lower acoustic frequencies and wherein a second loudspeaker responsive to higher acoustic frequencies is internally mounted on a wall of said speaker box in alignment with said second sound emission opening.

5. A loudspeaker apparatus for an electronic keyboard musical instrument according to claim 4, further comprising a duct internally mounted on a wall of said speaker box with one end of said duct being in alignment with said port.

6. A loudspeaker apparatus for an electronic keyboard musical instrument, said apparatus comprising:

- a shelf board constituting a casing of said musical instrument, said shelf board having a first sound emission opening;
- a first loudspeaker mounted on said shelf board in alignment with said first sound emission opening; and
- a speaker box mounted on said shelf board so as to enclose said first loudspeaker, said speaker box having a port,
- wherein said first loudspeaker is responsive to lower acoustic frequencies, and
- wherein a second loudspeaker responsive to higher acoustic frequencies is mounted on said shelf board outside and in close proximity to said speaker box.

7. A loudspeaker apparatus for an electronic keyboard musical instrument according to claim 6, further comprising a duct internally mounted on a wall of said speaker box with one end of said duct being in alignment with said port.

* * * * *